United States Patent
Okamoto et al.

(10) Patent No.: US 6,650,559 B1
(45) Date of Patent: Nov. 18, 2003

(54) POWER CONVERTING DEVICE

(75) Inventors: Kenji Okamoto, Kanagawa (JP); Kazuhiko Imamura, Mie (JP)

(73) Assignee: Fuji Electric Co., Ltd., Kawasaki (JP)

( * ) Notice: Subject to any disclaimer, the term of this patent is extended or adjusted under 35 U.S.C. 154(b) by 124 days.

(21) Appl. No.: 10/046,065

(22) Filed: Oct. 19, 2001

(30) Foreign Application Priority Data

Oct. 31, 2000 (JP) ........................................ 2000-332719

(51) Int. Cl.[7] .......................... H02M 1/00; H05K 7/20
(52) U.S. Cl. ........................................ 363/141; 361/688
(58) Field of Search .......................... 363/141, 144; 361/688, 704, 707, 709, 713, 720

(56) References Cited

U.S. PATENT DOCUMENTS 4,636,752 A * 1/1987 Saito ........................... 333/12
4,777,455 A * 10/1988 Sakamoto et al. ............. 333/12
6,078,117 A * 6/2000 Perrin et al. ............... 310/68 R

FOREIGN PATENT DOCUMENTS

| DE | 198 13 365 A1 | 11/1998 |
|---|---|---|
| DE | 199 10 787 A1 | 9/2000 |

* cited by examiner

*Primary Examiner*—Matthew V. Nguyen
(74) *Attorney, Agent, or Firm*—Greer, Burns & Crain, Ltd.

(57) ABSTRACT

A radiation container where a noise filter unit is sealed and accommodated with a resinous insulation material having a thermal conductive characteristic nearly equal to that of the radiation container, and a driving unit are directly installed on a radiating fin, whereby heat generated by the noise filter unit is efficiently dissipated on the radiating fin, and a necessary insulation characteristic is obtained.

12 Claims, 10 Drawing Sheets

PRIOR ART

PRIOR ART

POWER CONVERTING DEVICE

BACKGROUND OF THE INVENTION

1. Field of the Invention

The present invention relates to a power converting device having a noise filter for a power converter, which filters switching noise occurring with a switching operation of a semiconductor switch element.

2. Description of the Related Art

The switching operation of a semiconductor switch element which configures a power converter such as an inverter, etc. is performed based on a drive signal having a carrier frequency that is on the order of several kHz to ten-odd kHz, for which pulse-width modulation (PWM) is performed. This switching operation causes switching noise of a frequency component that is equal to or higher than several tens kHz from the power converter.

In recent years, a variety of legal regulations have been laid down for such a power converter to suppress the negative effect that a component of 100 kHz or higher exerts on an external device among the frequency components of such switching noise, and a noise filter for a power converter is used to address this problem.

Conventionally, a noise filter for a power converter of such a type is configured by connecting, for example, in the form of an inverted L, a reactor, which is a single unit and is formed by winding an electric wire around a core made of ferrite, an amorphous alloy, a crystal alloy, etc., and a capacitor, which is a single unit and is composed of a film, a chip, etc. A single integrated unit is wired at a stage preceding a power converter, so that switching noise occurring with the switching operation of a semiconductor switch element is filtered.

In recent years, the demand for a power converter in which such a noise filter is mounted has been increasing in order to save space or troublesomeness of wiring the power converter and a noise filter unit.

FIGS. 1 and 2 exemplify a configuration where a noise filter is arranged on a printed circuit board. FIG. 1 is its cross-sectional view, whereas FIG. 2 is its elevation view.

Noise filter elements, such as a reactor L 21, a ground capacitor Cy 22, an interphase capacitor Cx 23, etc. are mounted on a printed circuit board 7 with a pin insertion method, so that a noise filter substrate 8 is configured.

FIG. 3 shows an example where a power converter is configured by incorporating the noise filter substrate 8 shown in FIGS. 1 and 2.

This power converter is divided into upper, middle, and lower stages depending on functions, and is configured by a control substrate 9 that performs a signal process of a CPU, etc. or control operations, etc., a printed circuit board on which the above described noise filter substrate 8 of FIG. 1 is mounted, and a main circuit module 10 in which a rectifying circuit 3 and an inverter circuit 5 composed of a switching element 51 is arranged.

The noise filter substrate 8 is arranged between the control substrate 9 and the main circuit module 10. The control substrate 9 that generates a small amount of heat is normally arranged on the top.

The main circuit module 10 that generates a large amount of heat is directly arranged in the center of a radiating fin 11 via a radiation plate 60 such as a ceramic substrate, a metal base substrate, etc., which has superiority in heat radiation, for ease of cooling. Note that the main circuit module 10 is sealed with a silicon gel 70.

Terminal blocks 43 are arranged on the periphery of the radiating fin 11. The printed circuit board 8 and the control substrate 9 are configured as a plurality of stages via supports 41 fixed to the terminal blocks 43.

The power converter is configured by covering the noise filter substrate 8, the control substrate 9, and the main circuit module 10 with a case 12 fixed to the terminal blocks 43.

Conventionally, however, heat generation is caused by an occurrence loss such as a copper loss, etc. from the reactor 21 that configures the noise filter of this type. As shown in FIG. 3, if the reactor is mounted on the printed circuit board 7 within the power converter, the atmosphere temperature within the case 12 rises. Especially, if the capacity of the power converter increases, the atmosphere temperature within the case 12 significantly rises.

Moreover, since a power converter originally has a large occurrence loss of a power semiconductor, close attention is paid to the cooling of the power converter. A rise in the atmosphere temperature within the case 12, which is caused by another heat source, results in an increase in the temperature of the printed circuit board 7, that is, the control substrate 9, leading to a problem such that the heat-resistant lifetime of the components is shortened.

Additionally, in the 3-stage structure shown in FIG. 3, the heat radiation of the entire power converter deteriorates, and at the same time, its capacity becomes large.

It is desirable that the reactor 21 is arranged to contact the radiating fin 11 as much as possible. This is because cooling effect is low if the reactor 21 is mounted on the printed circuit board 7 within the power converter. However, since a ground potential normally occurs between the reactor 21 and the radiating fin 11, the reactor 21 and the radiating fin 11 must be suitably insulated.

SUMMARY OF THE INVENTION

An object of the present invention is to provide a power converting device that can efficiently dissipates heat generated by a noise filter on a radiating fin, and obtain a necessary insulation characteristic.

A power converting device according to the present invention is a power converting device that converts power supplied from a power source, and controls an electric appliance. This device comprises a noise filter unit, a driving unit, a radiation container, and a radiating substrate.

In a first aspect of the present invention, the noise filter unit removes a noise component occurring in the device itself, the driving unit has a function for rectifying the power supplied from the power source via the noise filter unit and a function for controlling the electric appliance, and the radiation container is configured by a substrate on which a thin-film resinous insulation layer and a metal plate are stacked, and has a predetermined thermal conductive characteristic and an insulation characteristic. In the power converting device according to the present invention, the noise filter unit is accommodated within the radiation container by being sealed with a resinous insulation material having a thermal conductive characteristic nearly equal to that of the thin-film resinous insulation layer of the radiation container, and the radiation container accommodating the noise filter unit and the driving unit are directly arranged on the radiating substrate.

In a second aspect of the present invention, the noise filter unit removes a noise component occurring in the device itself, the driving unit has a function for rectifying the power supplied from the power source via the noise filter unit and a function for controlling the electric appliance, and the radiation container is configured by a substrate on which a thin-film resinous insulation layer and a metal plate are stacked, and has a predetermined thermal conductive characteristic and an insulation characteristic. In the power converting device according to the present invention, the noise filter unit is sealed with a first resinous insulation material having a thermal conductive characteristic nearly equal to that of the thin-film resinous insulation layer of the radiation container, the driving unit is sealed with a second resinous insulation material and accommodated with the noise filter unit as one body, within the radiation container. The radiation container accommodating the noise filter unit and the driving unit as one body is directly arranged on the radiating substrate.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 1:
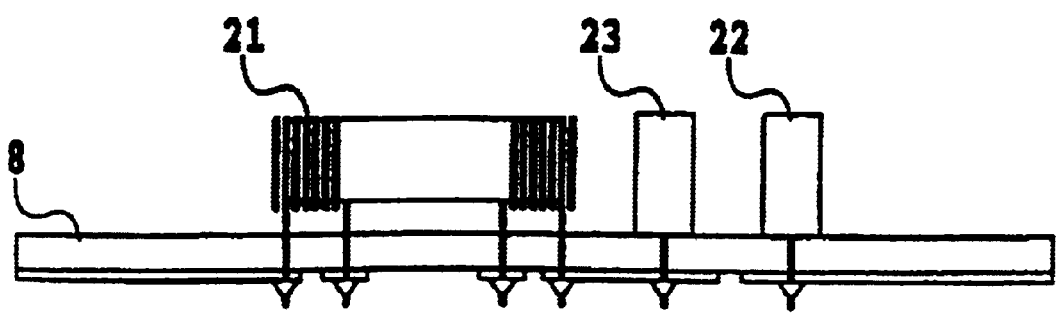
FIG. 1 is a cross-sectional view showing conventional noise filter components, etc. mounted on a printed circuit board.
Figure 2:
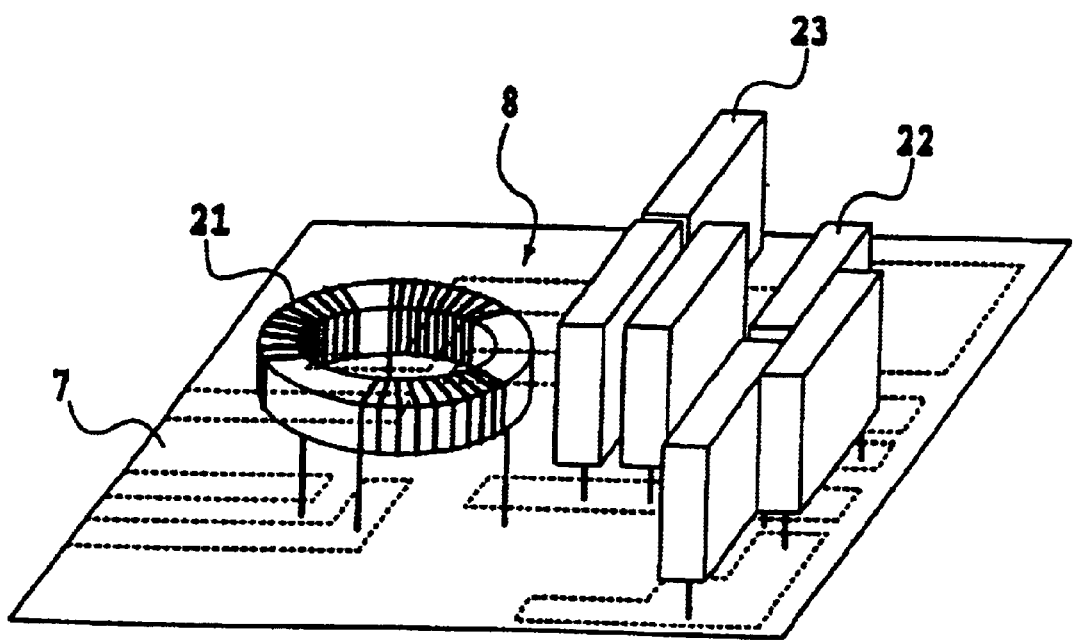
FIG. 2 is a perspective view showing the conventional noise filter components, etc. mounted on the printed circuit board.
Figure 3:
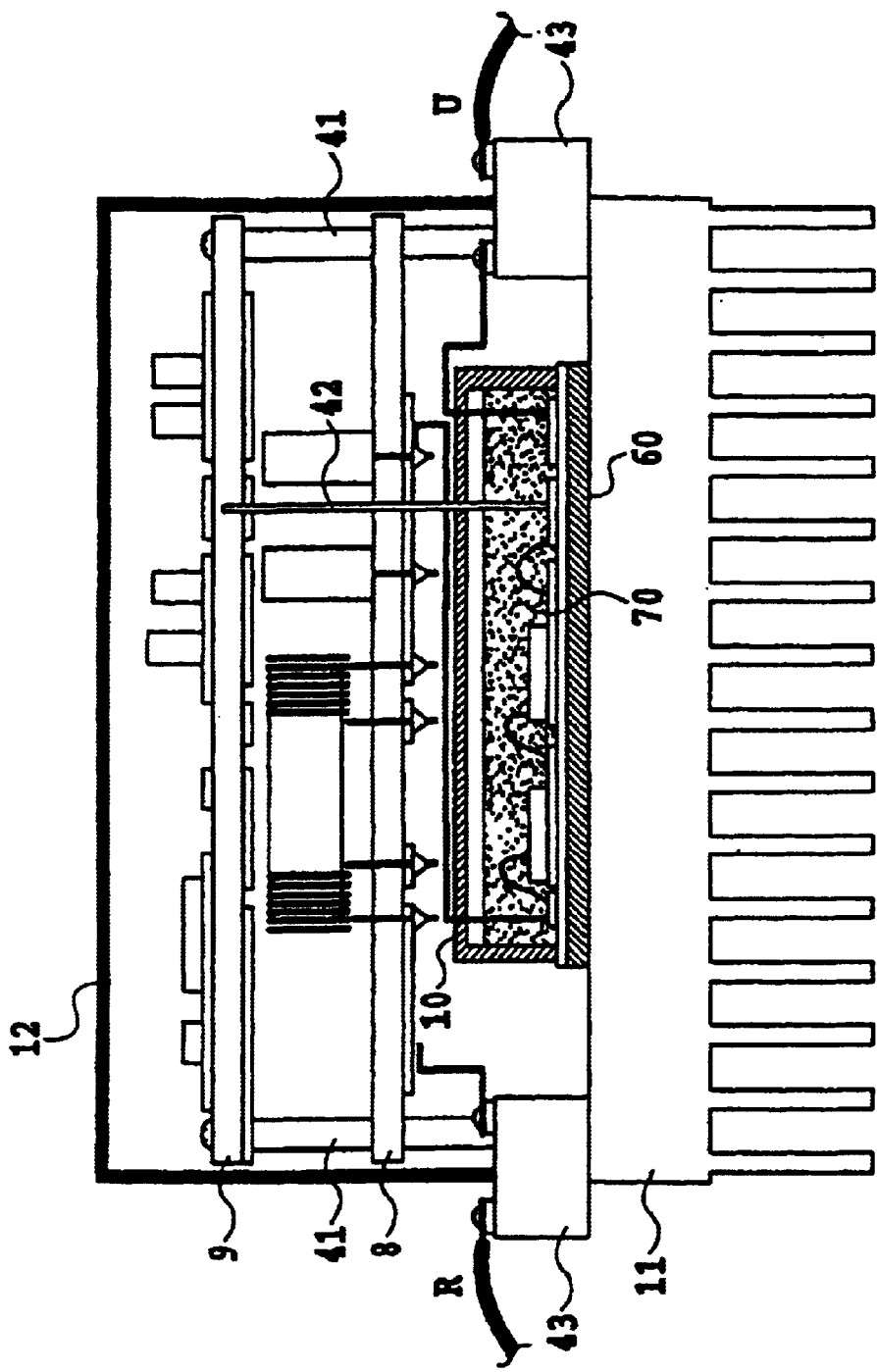
FIG. 3 is a cross-sectional view showing the conventional structure of a power converting device where a printed circuit board on which noise filter components, etc. are mounted is accommodated.

Hereinafter, preferred embodiments according to the present invention are described in detail with reference to the drawings.

The present invention is a power converting device that converts power supplied from a power source, and controls an electric appliance. This device comprises: a noise filter unit removing a noise component occurring in the device itself; a driving unit having a function for rectifying the power supplied from the power source via the noise filter unit, and a function for controlling the electric appliance; a radiation container that is configured by a substrate on which a thin-film resinous insulation layer and a metal plate are stacked, and has a predetermined thermal conductive characteristic and an insulation characteristic; and a radiating substrate. The noise filter unit is sealed and accommodated within the radiation container with a resinous insulation material having a thermal conductive characteristic nearly equal to that of the thin-film resinous insulation layer of the radiation container, and the radiation container accommodating the noise filter unit and the driving unit are directly installed on the radiating fin, so that the power converting device is configured.

The present invention is a power converting device that converts power supplied from a power source, and controls an electric appliance. This device comprises: a noise filter unit removing a noise component occurring in the device itself; a driving unit having a function for rectifying the power supplied from the power source via the noise filter unit, and a function for controlling the electric appliance; a radiation container that is configured by a substrate on which a thin-film resinous insulation layer and a metal plate are stacked, and has a predetermined thermal conductive characteristic and an insulation characteristic; and a radiating substrate. The noise filter unit is sealed with a first resinous insulation material having a thermal conductive characteristic nearly equal to that of the thin-film resinous insulation layer of the radiation container, and the driving unit is sealed with a second resinous insulation material and accommodated with the noise filter unit as one body, within the radiation container. The radiation container accommodating the noise filter unit and the driving unit as one body is directly installed on the radiating fin, so that the power converting device is configured.

Here, the radiation container may be configured as a container in the form of a box by bending the four sides of the substrate on which the thin-film resinous insulation layer and the metal plate are stacked.

This device may further comprise a signal processing unit, which is connected to the noise filter unit and the driving unit, performing a signal process for driving and controlling the electric appliance. The signal processing unit may be installed on the top of a support that is arranged upright on the periphery of the radiating fin.

The thin-film resinous insulation layer that configures the radiation container may be configured by a member having a high thermal conductive characteristic.

The thin-film resinous insulation layer that configures the radiation container may be configured by a resinous sheet having a flexible member that can be bent.

The resinous insulation material may be configured by a member having a high thermal conductive characteristic.

[First Preferred Embodiment]

The first preferred embodiment according to the present invention is explained with reference to FIGS. 4 through 8.

The present invention is characterized by the structure of a power converting device accommodating a noise filter for a power converter, and the structure of a radiation substrate accommodating the noise filter.

(Radiation Substrate)

First of all, the structure of the radiation substrate used as a container accommodating the noise filter is explained.

Figure 4:
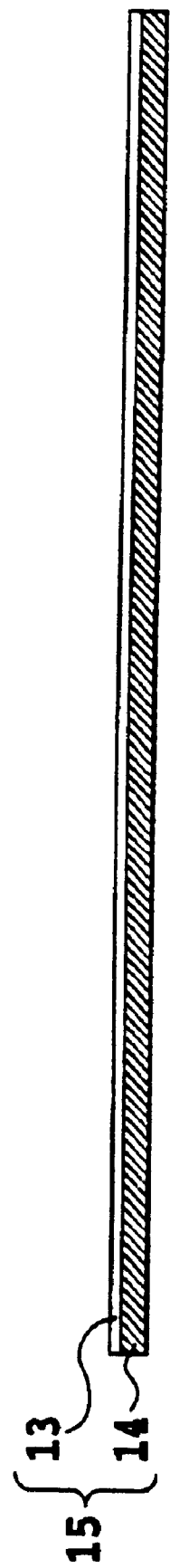
FIG. 4 is a cross-sectional view showing the structure of a laminate.

FIG. 4 exemplifies the structure of the radiation substrate.

This radiation substrate is configured by a laminate 15 composed of a thin-film resinous insulation layer 13, and a metal plate 14.

The metal plate 14 is made of an aluminum plate, a copper plate, an iron plate, or other metal plate. The thin-film resinous insulation layer 13 is made of a resinous material. The laminate 15 is configured by stacking the thin-film resinous insulation layer 13 onto the metal plate 14.

A method manufacturing the laminate 15 is described below.

Firstly, a coarsening process for forming projections and depressions is performed for the surface to be bonded of the metal plate 14, in order obtain a bonding characteristic between the thin-film resinous insulation layer 13 and the metal plate 14.

If the metal plate 14 is configured by an aluminum plate, the coarsening process is performed by forming minute empty holes with an alumite process. If the metal plate 14 is configured by a copper plate, the coarsening process is performed by forming projections and depressions with the generation of a fine acicular oxide, which is called a blackening process. A sufficient bonding power can be obtained also with a method etching a copper surface in the form of a depression of several $\mu$m, which is called microetching, in addition to the above described blackening process.

Next, the laminate 15 is manufactured by bonding the thin-film resinous insulation layer 13 to the metal plate 14 for which any of the above described coarsening processes is performed.

As the bonding method, a carrier sheet such as a polyethylene sheet, etc. in a prepreg state, which is generated by being coated with a resin (epoxy resin, polyimide resin, etc.), and by being dried up to, what is called, B stage (a process for solidifying a liquid resin to some extent by applying heat), is bonded to the metal plate 14 with a thermo-vacuum pressing machine, and solidified. The carrier sheet such as a polyethylene sheet can be removed by being peeled off after solidification.

Another bonding method can be implemented by directly stacking a bonding sheet in B stage, which is molded as a sheet with an epoxy or polyimide resin, onto the metal plate 14, and by bonding the sheet and the plate with a thermo-vacuum pressing machine, and by solidifying the bonded plate in a similar manner.

A further bonding method can be implemented by directly coating the metal plate 14 with a liquid resin, and by bonding the resin and the plate with a thermo-vacuum pressing machine via a stainless plate for molding.

The thin-film resinous insulation layer 13 may be formed with any of the above decribed bonding methods. However, it is desirable that its thickness is between 40 and 200 $\mu$m. If the thickness becomes thinner than 40 $\mu$m, a breakdown voltage drops, and an insulation characteristic cannot be obtained. Or, if the thickness becomes thicker than 200 $\mu$m, thermal resistance becomes high, and heat generated from the reactor L 21 cannot be dissipated efficiently.

[Radiation Container]

Next, the radiation container accommodating the noise filter is explained.

Figure 5:
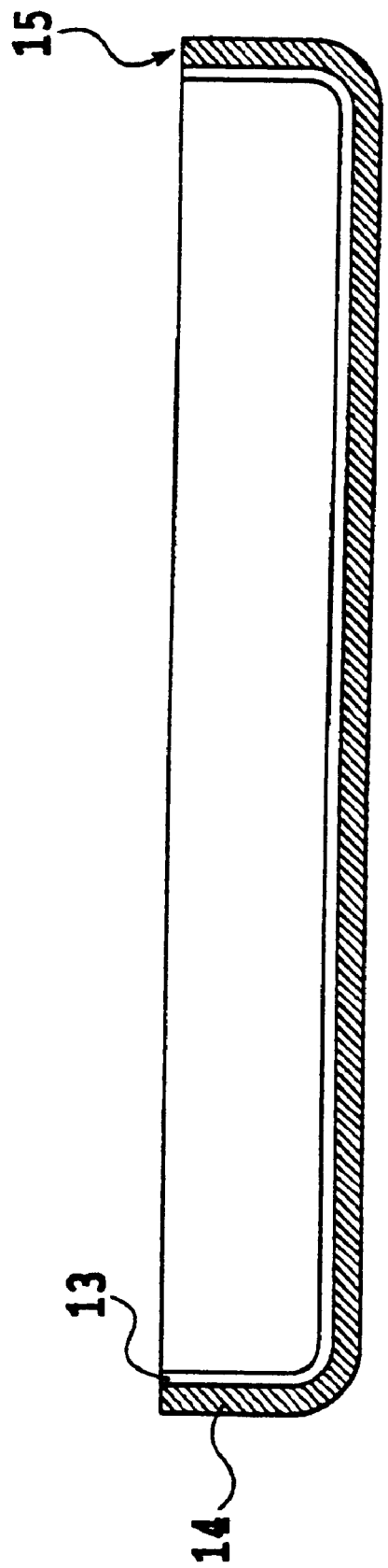
FIG. 5 is a cross-sectional view showing the structure of a radiation container processed by bending the laminate in the form of a box.

FIG. 5 shows the structure of the radiation container that is processed by cutting a molded laminate 15 into a predetermined area, and by bending its four sides by a predetermined depth.

Conductive noise filter components are accommodated within the laminate 15 thus configured. In this case, the laminate 15 can be bent with a pressing machine. Since a gap is formed at an angle of a bent side, it is filled, for example, with a silicon family resin, etc.

(Noise Filter Module)

Figure 6:
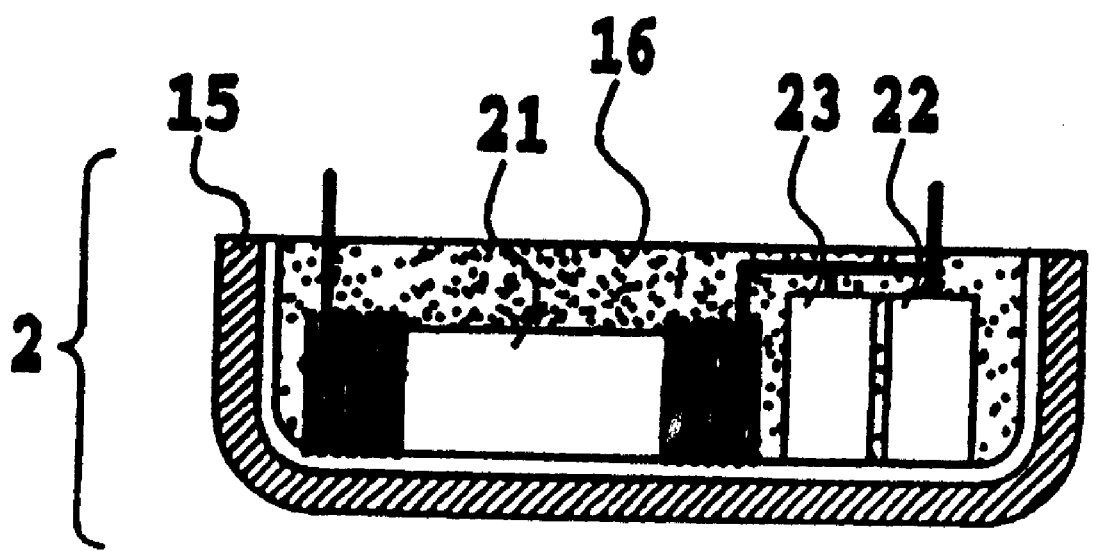
FIG. 6 is a cross-sectional view showing the structure in which a noise filter module is accommodated within the radiation container configured by the laminate and sealed with a resinous insulation material.

FIG. 6 shows the structure of the noise filter module 2 that is configured by using the laminate 15 of FIG. 5 processed by being bent.

The noise filter module 2 is configured by arranging noise filter elements such as a reactor L 21, a ground capacitor Cy 22, an interphase capacitor Cx 23, etc. within the laminate 15 processed by being bent, and by sealing the elements with a resinous insulation material 16.

The reactor L 21 for the noise filter can be connected to another circuit by extending a lead wire upward.

Here, a thermal expansion coefficient of the laminate 15 and that of the resinous insulation material 16 for sealing are set to nearly equal values, when the reactor L 21, which becomes a heat generation source, is accommodated within the laminate 15 being the radiation container. Note that, however, the nearly equal values referred to here include an equal value.

Specifically, the thermal expansion coefficient of the metal plate 14 which configures the laminate 15, and that of the resinous insulation material 16 are set to an equal value or values as close to one another as possible. For example, if aluminum is used as the metal plate 14, its thermal expansion coefficient is $23 \times 10^{-6}(°C.^{-1})$. Therefore, a material having a thermal expansion coefficient that is close to the above described value of aluminum is used as the resinous insulation material 16. Additionally, for example, if copper is used as the metal plate 14, its thermal expansion coefficient is $16 \times 10^{-6}(°C.^{-1})$. Therefore, a material having a thermal expansion coefficient that is close to the value of copper is used as the resinous insulation material 16.

By sealing the conductive noise filter components within the laminate 15 with the resinous insulation material 16 as described above, the following advantage is provided.

Heat generated by the loss of the reactor L 21 can be efficiently spread within the resinous insulation material 16.

That is, an enameled wire that is normally coated with a polyurethane resin, etc. is used as the wire wound around the reactor L 21. However, since the coating of the enameled wire is thin and does not have an insulation characteristic, the enameled wire cannot be made to directly contact a metal surface to be grounded. However, the thin-film resinous insulation layer 13 with which a suitable breakdown voltage can be obtained is used for the laminate 15. Therefore, the insulation characteristic does not become problematic, even if the enameled wire is laid directly. On the contrary, heat generated by a loss can be efficiently dissipated on the metal plate 14 side by making the reactor L 21 directly contact the thin-film resinous insulation layer 13.

Additionally, each lead wire 80 can be fixed with a resinous material, so that it can stand external forces when being wired to another circuit, and at the same time, no deformation, etc. occurs.

Furthermore, the thermal expansion coefficient of the laminate 15, especially, the thermal expansion coefficients of the metal plate 14 and the resinous insulation material 16 are made nearly equal, whereby peeling off or a crack due to a heat rise can be prevented.

(Power Converting Device)

Figure 7:
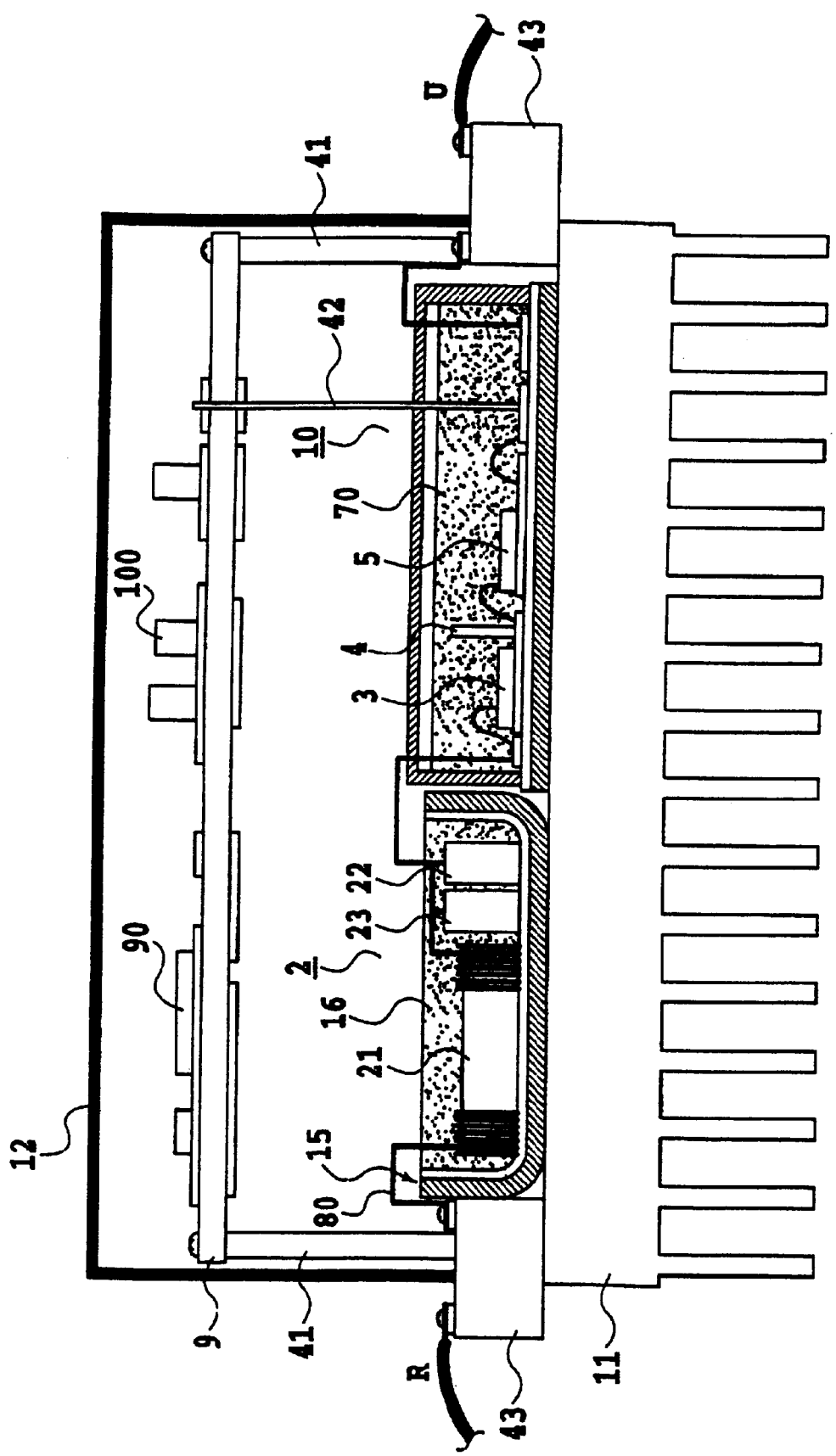
FIG. 7 is a cross-sectional view showing the configuration of a power converting device in which the radiation container accommodating the noise filter module is directly arranged on the radiating fin.

FIG. 7 exemplifies the configuration of the power converting device.

On the radiating fin 11, the noise filter module 2 shown in FIG. 6, and the main circuit module 10 are directly mounted.

Furthermore, on the upper ends of the supports 41, the control substrate 9 is fixed with screws, etc. A DC-DC converter 90, a control circuit 100, etc. are mounted on the control substrate 9.

The control substrate 9 is configured by a printed circuit board (glass-epoxy substrate) on which electronic components performing various control operations are mounted. This control substrate 9 is electrically connected to the noise filter module 2 and the main circuit module 10 via a connection pin 42.

With such a configuration, the following advantages can be provided.

(1) Since the noise filter module 2 is in direct contact with the radiating fin 11, heat generated by the reactor L 21 can be efficiently dissipated on the lower radiating fin 11 side.

As a result, a rise in the atmosphere temperature within the case 12 can be suppressed to a minimum in comparison with a conventional structure, even if heat is generated within the noise filter module 2. At the same time, measures against heat, which are taken for the other components, can be relieved. This eliminates the need for comprising extra members such as expensive or heat-resistant components, leading to a reduction in components cost.

(2) Only the control substrate 9 is arranged within the space of the case 12, which results in an extremely simple structure in comparison with the conventional 3-stage configuration shown in FIG. 1.

Such a simple configuration enables an assembly process to be significantly simplified, whereby operation efficiency can be improved, and yield can be enhanced. Additionally, the number of printed circuit boards can be decreased to one half or less, so that the number of components and a manufacturing cost can be dramatically reduced. Furthermore, because the conventional 3-stage configuration can be implemented as the 2-stage configuration, the height of the case 12 can be shortened, leading to downsizing also in a spatial manner.

(Circuitry Configuration)

Figure 8:
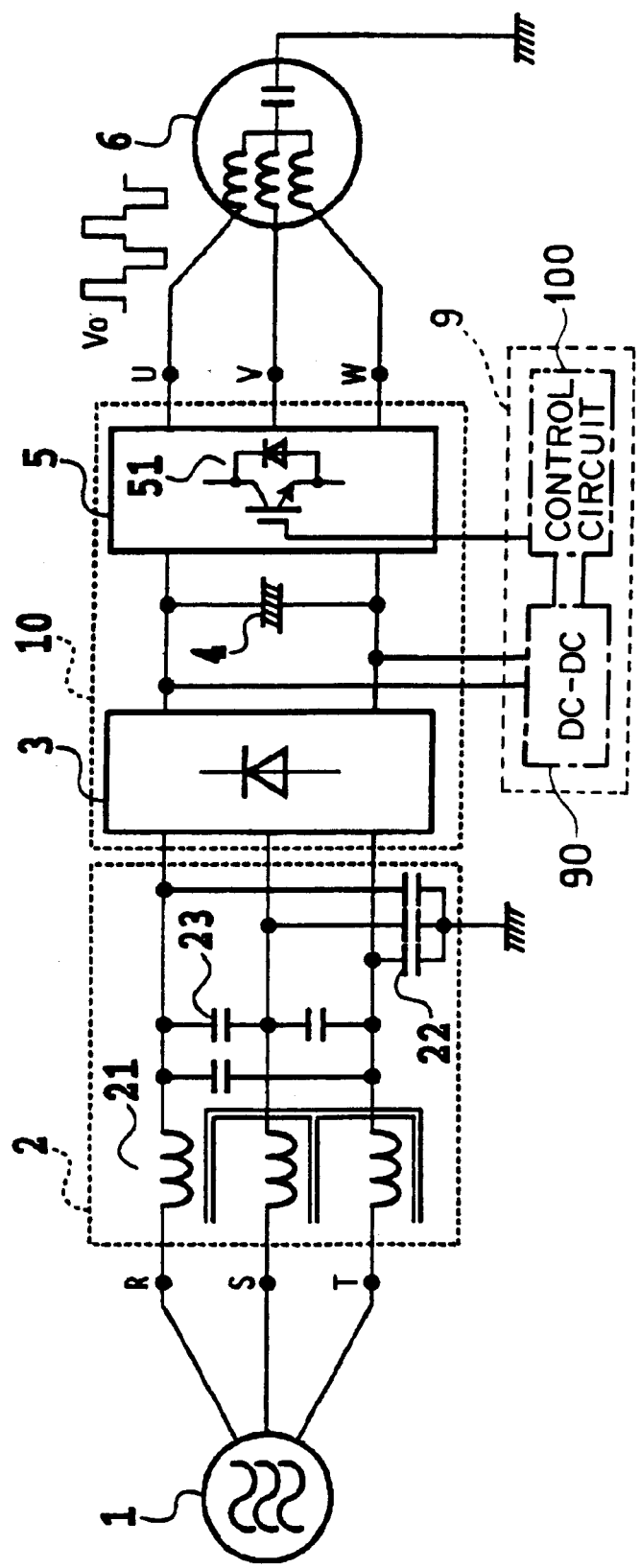
FIG. 8 is a simplified circuit diagram showing the configuration of electric circuitry in the power converting device shown in FIG. 7.

FIG. 8 shows the configuration of electric circuitry of the power converting device shown in FIG. 7.

The power converting device is broadly divided into three major circuit portions such as the noise filter module 2, the main circuit module 10, and the control substrate 9.

The noise filter module 2 is composed of the reactor L 21 that is connected to three power lines from a three-phase AC power supply 1 in series via input terminals R, S, and T, a ground capacitor Cy 22, and an interphase capacitor Cx 23.

This noise filter module 2 has a function for filtering a harmonic noise component such as switching noise, etc., which occurs with the switching operation of a semiconductor switch element configuring a power converter such as an inverter, etc.

The main circuit module 10 is composed of a rectifying circuit 3 connected to the noise filter module 2, a smoothing capacitor 4 connected between a pair of output terminals of the rectifying circuit 3, and an inverter circuit connected to the smoothing capacitor 4.

The inverter circuit 5 has a switching element 51 configured, for example, by an IGBT (Insulated-Gate Bipolar Transistor). Each switching element is controlled to be turned on/off. Note that an electric appliance, here, a three-phase induction motor 6 is connected as a load of the inverter circuit 5.

The control circuit 9 is composed of a DC-DC converter 90, a control circuit 100 which performs various signal processes and control operations and includes a CPU, a ROM, a RAM, etc., and the like.

The DC-DC converter 90 is connected to the output terminals of the rectifying circuit 3, and the power to which the power from the three-phase AC power supply 1 is rectified is input. The power that the DC-DC converter 90 converts into a predetermined value is supplied to the control circuit 100.

The control circuit 100 is connected to a gate terminal of the switching element 51 of the inverter circuit 5. The switching element 51 is controlled to be turned on/off based on a control signal from the control circuit 100. As a result, an output voltage $V_O$ for which pulse-width modulation (PWM) is performed is output from output terminals U, V, and W, so that the three-phase induction motor 6 is rotated.

[Second Preferred Embodiment]

Figure 9:
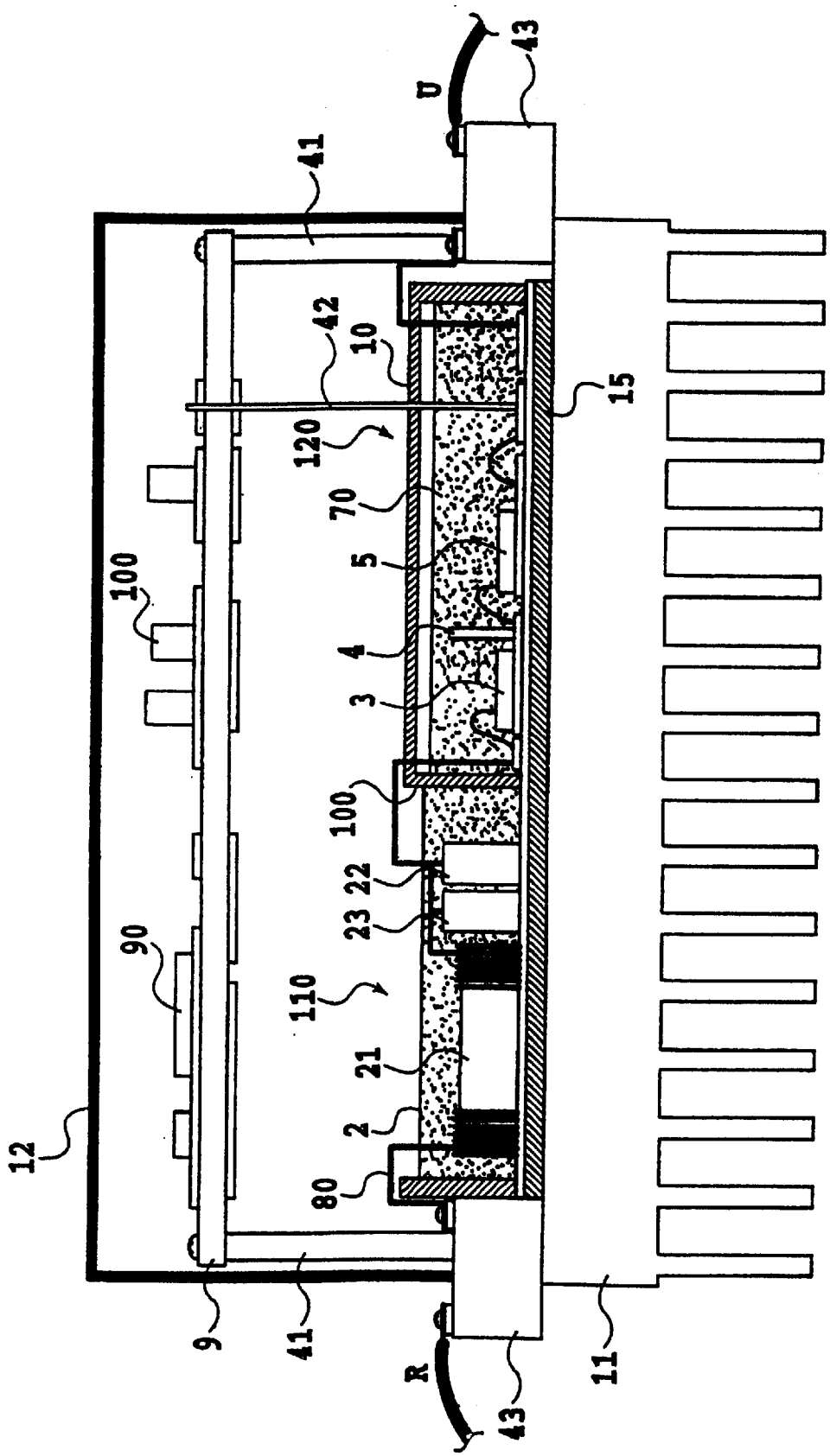
FIG. 9, which exemplifies a first modification of a second preferred embodiment according to the present invention, is a cross-sectional view showing the configuration of a power converting device in which a radiation container accommodating a noise filter module and a motor driving unit as one body is directly arranged on a radiating fin.
Figure 10:
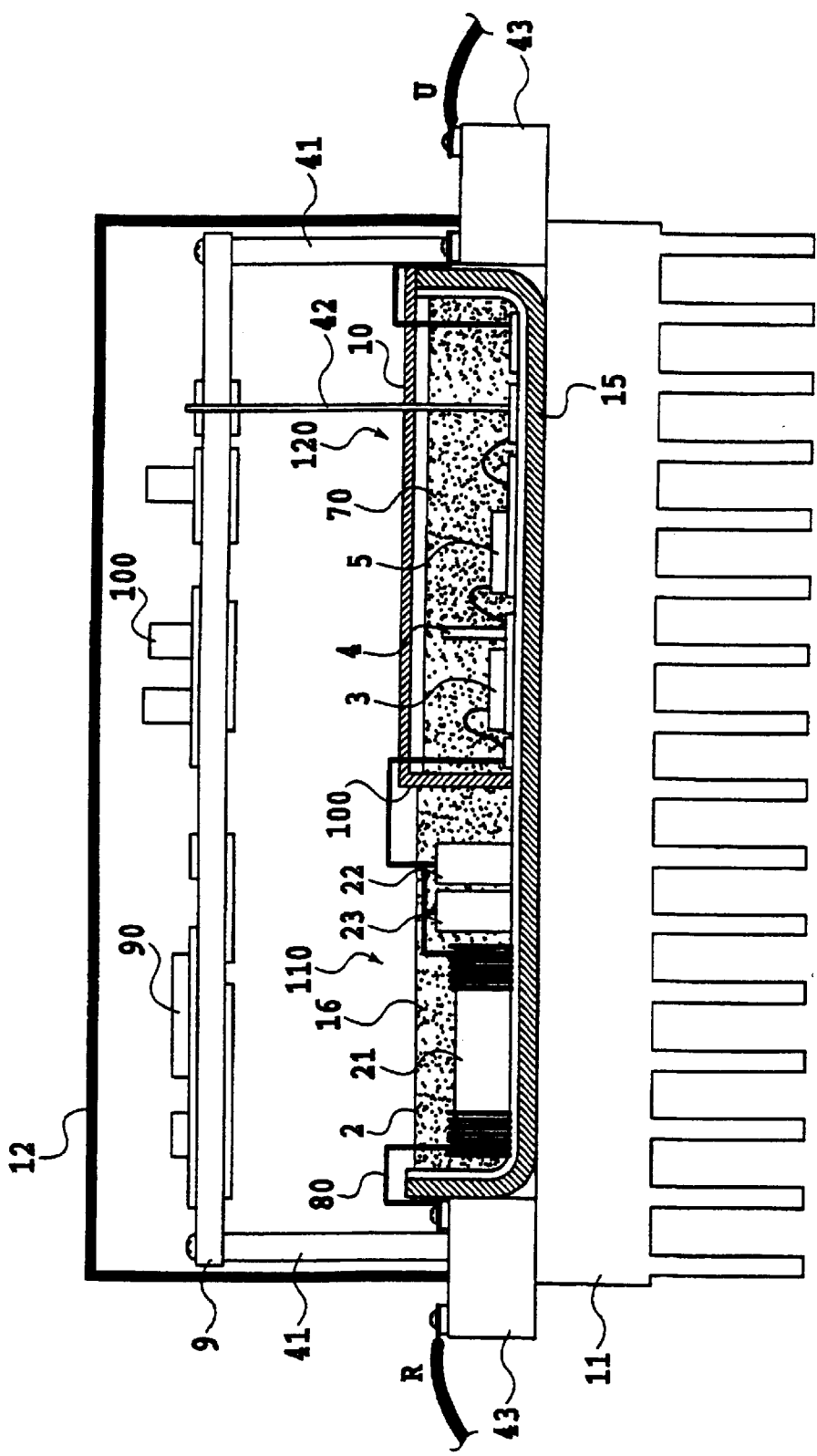
FIG. 10, which exemplifies a second modification of the second preferred embodiment according to the present invention, is a cross-sectional view showing the configuration of the power converting device in which the radiation container accommodating the noise filter module and the motor driving unit as one body is directly arranged on the radiating fin.

Next, the second preferred embodiment according to the present invention is explained with reference to FIGS. 9 and 10. Explanations of the same portions as those of the above described first embodiment are omitted, and the same reference numerals are given.

This preferred embodiment is an example where the structure of the laminate 15 as a radiation container having a predetermined dissipation characteristic and an insulation characteristic is modified.

(First Modification Example)

The first modification example is described with reference to FIG. 9.

In this figure, the laminate 15 is formed all over the radiating fin 11. The laminate 15 is partitioned into two rooms 110 and 120 in its middle by a partitioning plate 100.

One room 100 on the laminate 15 accommodates the components of the noise filter module 2 composed of the reactor L 21, the ground capacitor Cy 22, and the interphase capacitor Cx 23, which are sealed with the resinous insulation material 16.

The other room 120 on the laminate 15 accommodates the components of the main circuit module 10 composed of the rectifying circuit 3, the smoothing capacitor 4, and the inverter circuit 5, which are sealed with the silicon gel 70.

The laminate 15 is structured by sharing its bottom portion as described above, so that a wide dissipation area can be taken, and the number of components can be reduced by being shared. Accordingly, an assembly process can be simplified, and a production cost can be further reduced.

(Second Modification Example)

The second modification example is explained with reference to FIG. 10.

In this example, not only the bottom portion of the laminate 15, but also the side peripheral to the bottom is shared and structured as one body.

With such one-body structure, a dissipation area can be much more widened not only at the bottom, but also on the side, thereby further reducing the number of components.

[Third Preferred Embodiment]

Next, the third preferred embodiment according to the present invention is explained. Explanations of the same portions as those in the above described embodiments are omitted, and the same reference numerals are given.

This embodiment is an example of a configuration material of the laminate 15.

To efficiently conduct the heat generated by the reactor L 21 to the metal plate 14 via the thin-film resinous insulation layer 13, it is more effective that the thermal conductivity of the thin-film resinous insulation layer 13 is as high as possible.

Therefore, as the thin-film resinous insulation layer 13, a material into which a resinous material and an inorganic filling material are appropriately mixed is used in this embodiment. A material including an epoxy or a polyimide resin as a base is used as the resinous material. As the inorganic filling material, quartz, alumina, boron nitride, aluminum nitride, silicon nitride, magnesium oxide, etc., or their mixture is used.

It is desirable to use the thin-film resinous insulation layer 13 which is formed by the above described materials, and whose thermal conductivity ranges between 1.0 and 10 W/m.K, more preferably, between 1.0 and 7 W/m.K.

If the thin-film resinous insulation layer 13 including the inorganic filling material is bent, a crack occurs. However, the elements such as the reactor L 21, the ground capacitor Cy 22, the interphase capacitor Cx 23, etc., which are intended for the noise filter 2, are fully apart from the bent portion, and there is no fear of a problem such as an insulation failure, etc.

[Fourth Preferred Embodiment]

Next, the fourth preferred embodiment according to the present invention is explained. Explanations of the same portions as those in the above described embodiments are omitted, and the same reference numerals are given.

This embodiment is an example where a flexible resinous material is used for a bent portion of the thin-film resinous insulation layer 13 which configures the laminate 15, so as not to cause a crack.

As the flexible resinous material, a bonding sheet that does not include an epoxy or a polyimide family inorganic filling material is used.

The thermal conductivity of the flexible resinous material becomes low if it does not include an inorganic filling material. Therefore, the thickness of the insulation layer is suitably between 40 and 75 $\mu$m, and more preferably, between 40 and 50 $\mu$m. If the thickness becomes 40 $\mu$m or thinner, insulation reliability cannot be obtained. If the thickness becomes 75 $\mu$m or thicker, thermal resistance becomes high, which is undesirable.

[Fifth Preferred Embodiment]

Next, the fifth preferred embodiment according to the present invention is explained. Explanation of the same portions as those in the above described embodiments are omitted, and the same reference numerals are given.

This embodiment is an example of a configuration material of the resinous insulation material 16 used as a sealing member of the noise filter module 30.

An inorganic filling material such as quartz, alumina, boron nitride, aluminum nitride, silicon nitride, magnesium oxide, etc., or their mixture is added to a resinous material such as an epoxy resin, a urethane resin, a silicon resin, etc., so that the resinous insulation material 16 having a high thermal conductive characteristic is manufactured.

In this case, it is desirable to use the resinous insulation material 16 having a thermal conductive characteristic, for example, a thermal conductivity that ranges between 1.0 and 10 W/m.K, more preferably, between 1.0 and 7 W/m.K.

By using the resinous insulation material 16 having a high thermal conductivity, heat generated from the elements such as the reactor L 21, the ground capacitor Cy 22, the interphase capacitor Cx 23, etc., which are intended for the noise filter 2, especially, the heat generated from the reactor L 21 can be spread as a whole.

The heat thus spread can be dissipated on the radiating fin 11 via the laminate 15. As a result of spreading the heat, a heat density can be reduced, and thermal resistance per unit area can be lowered.

Additionally, it is necessary that the thermal expansion coefficient of the resinous insulation material 16 is made to suit that of ferrite if a ferrite core is used for the reactor L 21, in order not to cause a distortion due to thermal stress. Adding an inorganic filling material for obtaining a high thermal conductivity enables a thermal expansion coefficient to be reduced, leading to a decrease in the thermal stress at the same time.

Filling of the insulation resinous material 16 is made under a normal pressure or a reduced pressure of 1 to 150 (Torr) [=133~19.95×10$^3$(Pa)]. A reduced pressure of 1 to 50 (Torr) [=133~6.65×10$^3$(Pa)] is more preferable, because a void is difficult to remain in a gap between the reactor L 21, etc. and the laminate 15.

The above described preferred embodiments refer to the examples where the three-phase induction motor 6 is used as an electric appliance. However, the present invention is not limited to these examples, and is applicable to, for example, an induction heating coil, a switching power supply, an uninterruptible power system (UPS), etc.

As described above, according to the present invention, a noise filter unit is sealed and accommodated within a radiation container with a resinous insulation material having a thermal conductive characteristic nearly equal to that of the radiation container, and the radiation container accommodating the noise filter unit and a driving unit are directly installed and mounted on a radiating fin, whereby heat generated by the noise filter, which is a heat generation source, can be efficiently dissipated on the radiating fin side via the radiation container, a rise in the atmosphere temperature within a hermetically sealed case can be suppressed to a minimum, and also a necessary insulation characteristic can be secured. As a result, an assembly can be simplified owing to a simple configuration, and a power converting device accommodating a cheap and small noise filter can be manufactured.

Additionally, according to the present invention, a noise filter unit is sealed with a first resinous insulation material having a thermal conductive characteristic nearly equal to that of a radiation container, and a driving unit is sealed with a second resinous insulation material and accommodated with the noise filter unit as one body, within the radiation container. The radiation container accommodating the noise filter unit and the driving unit as one body is directly installed and mounted on a radiating fin. As a result, heat can be dissipated on the radiating fin side more efficiently, and at the same time, an assembly can be further simplified by sharing components, so that a power converting device accommodating a cheaper and smaller noise filter can be manufactured.

What is claimed is:

1. A power converting device converting power supplied from a power source, and controlling an electric appliance, comprising:

a noise filter unit removing a noise component occurring in the device itself;

a driving unit having a function for rectifying the power supplied from the power source via said noise filter unit, and a function for controlling the electric appliance;

a radiation container that is configured by a substrate on which a thin-film resinous insulation layer and a metal plate are stacked, and has a predetermined thermal conductive characteristic and an insulation characteristic; and a radiating substrate, wherein said noise filter unit is sealed and accommodated within said radiation container with a resinous insulation material having a thermal conductive characteristic nearly equal to the thermal conductive characteristic of said thin-film resinous insulation layer of said radiation container, and said radiation container accommodating said noise filter unit, and said driving unit are directly installed on said radiating substrate.

2. The power converting device according to claim 1, wherein said radiation container is configured as a container in a form of a box by bending four sides of the substrate on which the thin-film resinous insulation layer and the metal plate are stacked.

3. The power converting device according to claim 1, further comprising a signal processing unit, which is connected to said noise filter unit and said driving unit, performing a signal process for controlling the electric appliance, said signal processing unit installed on a top of a support that is arranged upright on a periphery of said radiating substrate.

4. The power converting device according to claim 1, wherein the thin-film resinous insulation layer configuring said radiation container is configured by a member having a high thermal conductive characteristic.

5. The power converting device according to claim 1, wherein the thin-film resinous insulation layer configuring said radiation container is configured by a resinous sheet having a flexible member that can be bent.

6. The power converting device according to claim 1, wherein the resinous insulation material is configured by a member having a high thermal conductive characteristic.

7. A power converting device converting power supplied from a power source, and controlling an electric appliance, comprising:

a noise filter unit removing a noise component occurring in the device itself;

a driving unit having a function for rectifying the power supplied from the power source via said noise filter unit, and a function for controlling the electric appliance;

a radiation container that is configured by a substrate on which a thin-film resinous insulation layer and a metal plate are stacked, and has a predetermined thermal conductive characteristic and an insulation characteristic; and a radiating substrate, wherein within said radiation container, said noise filter unit is sealed with a first resinous insulation material having a thermal conductive characteristic nearly equal to the thermal conductive characteristic of said thin-film resinous insulation layer of said radiation container, said driving unit is sealed with a second resinous insulation material within said radiation container, and said noise filter unit and said driving unit are accommodated as one body, and said radiation container accommodating said noise filter unit and said driving unit as one body is directly installed on said radiating substrate.

8. The power converting device according to claim 7, wherein said radiation container is configured as a container in a form of a box by bending four sides of the substrate on which the thin-film resinous insulation layer and the metal plate are stacked.

9. The power converting device according to claim 7, further comprising a signal processing unit, which is connected to said noise filter unit and said driving unit, performing a signal process for controlling the electric appliance, said signal processing unit installed on a top of a support that is arranged upright on a periphery of said radiating substrate.

10. The power converting device according to claim 7, wherein the thin-film resinous insulation layer configuring said radiation container is configured by a member having a high thermal conductive characteristic.

11. The power converting device according to claim 7, wherein the thin-film resinous insulation layer configuring said radiation container is configured by a resinous sheet having a flexible member that can be bent.

12. The power converting device according to claim 7, wherein the resinous insulation material is configured by a member having a high thermal conductive characteristic.

* * * * *